US012663438B2

(12) United States Patent
Jun et al.

(10) Patent No.: US 12,663,438 B2
(45) Date of Patent: Jun. 23, 2026

(54) TEST SOCKET AND ASSEMBLY DEVICE THEREOF

(71) Applicant: okins electronics Co., Ltd, Uiwang-si (KR)

(72) Inventors: Jin Kook Jun, Gunpo-si (KR); Chan Ho Lee, Siheung-si (KR); Seung Hyun Noh, Sacheon-si (KR)

(73) Assignee: okins electronics Co., Ltd, Uiwang-si (KR)

( * ) Notice: Subject to any disclaimer, the term of this patent is extended or adjusted under 35 U.S.C. 154(b) by 163 days.

(21) Appl. No.: 18/644,107

(22) Filed: Apr. 24, 2024

(65) Prior Publication Data

US 2024/0361352 A1     Oct. 31, 2024

(30) Foreign Application Priority Data

Apr. 27, 2023     (KR) ........................ 10-2023-0055258

(51) Int. Cl.
G01R 31/00          (2006.01)
G01R 1/04          (2006.01)
G01R 31/28          (2006.01)

(52) U.S. Cl.
CPC ....... G01R 1/0466 (2013.01); G01R 31/2863 (2013.01)

(58) Field of Classification Search
CPC ........................ G01R 31/2863; G01R 31/2628; G01R 31/28; G01R 31/2849; G01R 31/2884; G01R 31/2887; G01R 31/2896; G01R 31/2886; G01R 31/0408; G01R 31/0483; G01R 31/0466; G01R 31/0433;

G01R 31/2893; G01R 31/2851; G01R 1/0466; G01R 1/0483; G01R 1/07342; G01R 1/06711; G01R 1/06738; G01R 1/06772

See application file for complete search history.

(56) References Cited

U.S. PATENT DOCUMENTS

| 6,811,407 B2 * | 11/2004 | Watanabe | .......... H01R 13/2435 439/331 |
|---|---|---|---|
| 7,462,056 B2 * | 12/2008 | Yeh | .................... H01R 12/7005 439/73 |

(Continued)

FOREIGN PATENT DOCUMENTS

| CN | 101103451 A | 1/2008 |
|---|---|---|
| KR | 20060083060 A | 7/2006 |

(Continued)

*Primary Examiner* — Thang X Le
(74) *Attorney, Agent, or Firm* — Bayramoglu Law Offices LLC

(57)          ABSTRACT

A test socket for testing the electrical characteristics of a semiconductor device provides a test socket, including a housing in which a plurality of first through holes are formed; a cover in which a plurality of second through holes are formed; and a plurality of contact pins inserted into the plurality of first and second through holes, wherein the plurality of contact pins include an elastic part capable of elastic deformation in the longitudinal direction; a first contact part comprising: a first support part extending from one end of the elastic part, a stroke part connected to an end of the first support part and movable in the longitudinal direction, and a first contact tip connected to an end of the stroke part and exposed in the first through hole.

11 Claims, 13 Drawing Sheets

(56) References Cited

U.S. PATENT DOCUMENTS

| | | | | |
|---|---|---|---|---|
| 9,653,833 | B2 * | 5/2017 | Suzuki ................. | H05K 7/1069 |
| 10,656,179 | B2 * | 5/2020 | Ota .................... | G01R 1/06722 |
| 2002/0048954 | A1 | 4/2002 | Zhou et al. | |
| 2007/0243727 | A1 * | 10/2007 | Kanesashi ........... | H01R 13/193 |
| | | | | 439/73 |
| 2008/0207036 | A1 * | 8/2008 | Hwang ................ | G01R 1/0483 |
| | | | | 439/331 |
| 2009/0224782 | A1 | 9/2009 | Chen et al. | |
| 2019/0094269 | A1 * | 3/2019 | Teranishi ........... | G01R 1/06738 |
| 2022/0397587 | A1 * | 12/2022 | Lou .................... | G01R 1/06738 |

FOREIGN PATENT DOCUMENTS

| | | | |
|---|---|---|---|
| KR | 20090006613 | A | 1/2009 |
| KR | 20170066756 | A | 6/2017 |
| KR | 20180121717 | A | 11/2018 |
| KR | 102164373 | B1 | 10/2020 |
| TW | M342638 | U | 10/2008 |
| TW | 201633636 | A | 9/2016 |
| WO | 2020235769 | A1 | 11/2020 |

* cited by examiner

330 : 331, 332, 333

330 : 331, 332, 333

330 : 331, 332, 333

300

31a

33a

31

33

TEST SOCKET AND ASSEMBLY DEVICE THEREOF

CROSS-REFERENCE TO RELATED APPLICATION

This application claims priority to and the benefit of Korean Patent Application No. 10-2023-0055258, filed on Apr. 27, 2023, the entire contents of which is incorporated herein by reference in its entirety.

TECHNICAL FIELD

The present invention relates to a test socket for testing the electrical characteristics of semiconductor devices and a manufacturing device thereof.

BACKGROUND

In general, semiconductor devices are manufactured by integrating electronic circuits at high density on a circuit board, and after the semiconductor device is manufactured, it goes through an inspection process to check whether the semiconductor device operates properly before assembling it into a product.

This inspection work is carried out by putting a semiconductor device into a test socket, and to this end, the test socket is equipped with a plurality of contact pins, so when the terminal of the semiconductor device in contact with the contact pin, energization is performed, and the semiconductor device is inspected using a test device.

Conventional semiconductor devices mainly have optical pitches with relatively wide pitches, such as 1.0 mm and 0.8 mm, which are intervals between terminals, but recently, as miniaturization and thinning of semiconductor devices are accelerating, the pitch of semiconductor devices is also becoming narrower and finer (narrow pitches) than the conventional pitches.

The contact pin is formed by being bent at the center so as to be elastically deformable in the longitudinal direction.

The plurality of contact pins are automatically inserted into through holes formed in a housing of the test socket, and when the pitch of the semiconductor device is less than a certain dimension (when the bending state of the contact pin is wider than the pitch), when the contact pin is inserted into the housing of the test socket, it interferes with or collides with neighboring contact pins, resulting in a defect in the contact pin or a problem that cannot be automatically inserted.

Accordingly, since an automatic insertion device cannot be used at a pitch below a certain dimension (e.g., 0.8 mm), it is inconvenient to insert the contact pins into the housing of the test socket by hand while risking a slight or certain collision.

In addition, a conventional test socket is assembled by inserting lower ends of a plurality of contact pins into through holes formed in the housing while standing up, and then inserting upper ends of the plurality of contact pins into through holes formed in a cover in this state.

In this case, if the plurality of contact pins are not fixed in a standing up state in which they are inserted into the through holes formed in the housing, the through holes formed in the cover cannot be accurately inserted into the upper ends of the plurality of contact pins. In particular, as the number of contact pins increases and the gap between contact pins decreases, it is difficult to accurately insert the through holes formed in the cover into the upper ends of the plurality of contact pins.

However, when the lower ends of the plurality of contact pins are fixed to the through holes formed in the housing, there is a problem that the flatness tolerance of the test device cannot be compensated.

That is, if the lower ends of the plurality of contact pins are fixed to the through holes formed in the housing and the test device has a flatness tolerance, when contact tips of the plurality of contact pins are pressed by contacting a contact pad of the test device, a problem occurs in which some of the plurality of contact pins do not contact the contact pad of the test device.

The above information disclosed in this Background section is only for enhancement of understanding of the background of the invention and it may therefore contain information that does not form the prior art that is already known to a person of ordinary skill in the art.

SUMMARY

The present invention is directed to providing a contact pin for a test socket, which may form a plurality of contact pins at a smaller pitch, and may prevent interference or collision between contact pins when the plurality of contact pins are automatically inserted, and a test socket including the same.

In addition, the present invention is directed to providing a test socket manufacturing device capable of accurately inserting through holes formed in a cover into upper ends of the plurality of contact pins by fixing lower ends of the plurality of contact pins.

In addition, the present invention is directed to providing a test device capable of contacting all of a plurality of contact tips to a plurality of contact pads by configuring the lower ends of the plurality of contact pins to be moved in the up-down direction even when the plurality of contact pads of the test device have flatness tolerances.

The technical problems to be achieved in the present invention are not limited to the technical problems mentioned above, and other technical problems not mentioned will be clearly understood by those of ordinary skill in the art from the following description.

To achieve the above described objects, the present invention relates to a test socket for testing the electrical characteristics of a semiconductor device, and provides a test socket, including a housing in which a plurality of first through holes are formed; a cover in which a plurality of second through holes are formed; and a plurality of contact pins inserted into the plurality of first and second through holes, wherein the plurality of contact pins include an elastic part capable of elastic deformation in the longitudinal direction; a first contact part comprising: a first support part extending from one end of the elastic part, a stroke part connected to an end of the first support part and movable in the longitudinal direction, and a first contact tip connected to an end of the stroke part and exposed in the first through hole; and a second contact part comprising: a second support part extending from the other end of the clastic part, and a second contact tip connected to an end of the second support part and exposed in the second through hole.

Here, the first through hole may include a first stroke hole formed on a side of the first contact tip and a second stroke hole that communicates with the first stroke hole and has a larger width than the first stroke hole.

In addition, the first through hole may have a stepped jaw part formed between the first and second stroke holes.

In addition, the stroke part may include an exposed part that is inserted into the first stroke hole and at least a portion of which is exposed in the first through hole, and a first stopper that is inserted into the second stroke hole and is caught by the stepped jaw part to restrict movement of the stroke part.

In addition, the first stopper may protrude further outward than the exposed part.

In addition, the length of the exposed part exposed in the first through hole may vary depending on the external force applied to the first contact tip.

In addition, the first stroke hole may have a larger width than the exposed part and a smaller width than the first stopper.

In addition, the second stroke hole may have a larger width than the first stopper.

In addition, the second contact part may further include a second stopper that is provided on one side of the second support part and restrains movement of the third contact part.

In addition, the present invention provides a device for assembling a test socket for testing the electrical characteristics of a semiconductor device, the test socket assembly device including a housing in which a plurality of first through holes are formed; a cover in which a plurality of second through holes are formed; a plurality of contact pins inserted into the plurality of first and second through pin; and a press-fit plate having a plurality of press-fit grooves into which the plurality of contact pins are inserted and capable of being coupled to and removable from the housing, wherein the plurality of contact pins includes an elastic part capable of elastic deformation in the longitudinal direction; a first contact part comprising: a first support part extending from one end of the elastic part, a stroke part connected to an end of the first support part and movable in the longitudinal direction, and a first contact tip connected to an end of the stroke part and exposed in the first through hole; and a second contact part comprising: a second support part extending from the other end of the elastic part, and a second contact tip connected to an end of the second support part and exposed in the second through hole.

In addition, the first through hole may include a first stroke hole formed on a side of the first contact tip and a second stroke hole that communicates with the first stroke hole and has a larger width than the first stroke hole.

In addition, the first through hole may have a stepped jaw part formed between the first and second stroke holes.

In addition, the stroke part may include an exposed part that is inserted into the first stroke hole and at least a portion of which is exposed in the first through hole, and a first stopper that is inserted into the second stroke hole and is caught by the stepped jaw part to restrict movement of the stroke part.

In addition, the first stopper may protrude further outward than the exposed part.

In addition, the first stroke hole may have a larger width than the exposed part and a smaller width than the first stopper, and the second stroke hole may have a larger width than the first stopper.

In addition, the press-fit groove may be formed to have a smaller width than the exposed part.

In addition, the exposed part may be forcibly fitted and fixed to the press-fit groove.

According to the present invention, a plurality of contact pins can be formed at a smaller pitch, and interference or collision between the contact pins can be prevented when the plurality of contact pins are automatically inserted.

In addition, according to the present invention, since the upper and lower contact tips are located on different lines, a plurality of contact pins can be inserted more densely than those located on the same line, thereby further reducing a pitch between the contact pins.

In addition, according to the present invention, since the lower ends of a plurality of contact pins are fixed, through holes formed in a cover can be accurately inserted into the upper ends of a plurality of contact pins. In particular, even if the number of contact pins is large and the gap between the contact pins is small, it is easy to accurately insert the through holes formed in the cover into the upper ends of the plurality of contact pins.

In addition, according to the present invention, even when the plurality of contact pads of the test device have flatness tolerances, all of a plurality of contact tips can be contacted to a plurality of contact pads by configuring the lower ends of the plurality of contact pins to be moved in the up-down direction.

The effects of the present invention are not limited to those mentioned above, and other effects not mentioned will be clearly understood by those of ordinary skill in the art from the following description.

DETAILED DESCRIPTION OF THE EMBODIMENTS

Figure 1:
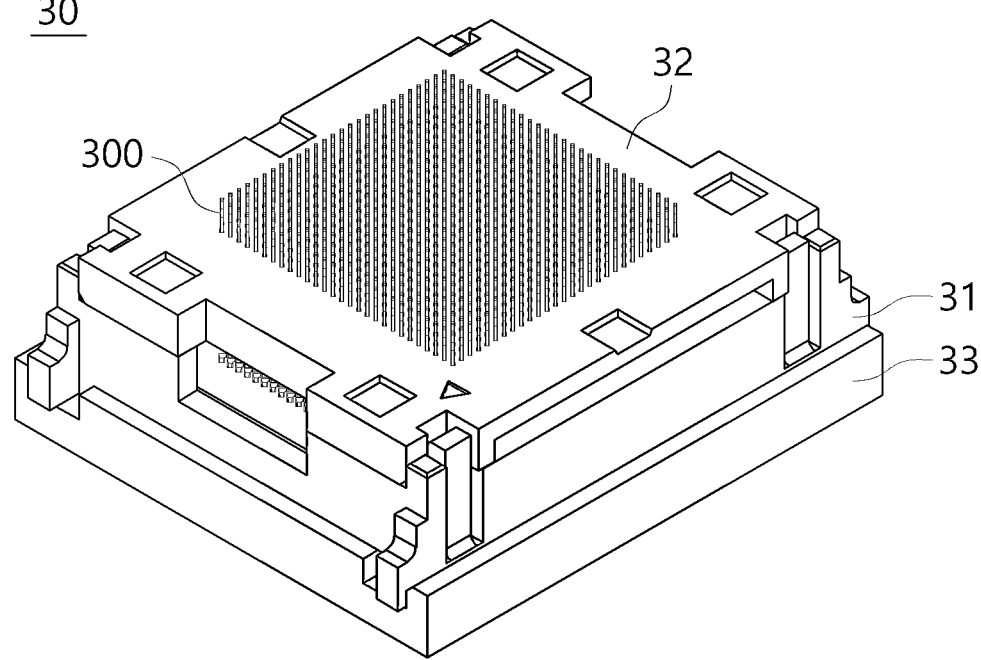
FIG. 1 is an overall perspective view of a test socket assembly device according to an exemplary embodiment of the present invention.

Preferred embodiments according to the present invention will be described in detail with reference to the accompanying drawings, but the same or similar components are assigned the same reference numerals regardless of the drawing numerals, and redundant description thereof will be omitted.

In addition, in describing the present invention, when it is determined that a detailed description of a related known technology may obscure the subject matter of the present invention, the detailed description will be omitted. In addition, it should be noted that the accompanying drawings are only intended to facilitate easy understanding of the idea of the present invention, and should not be construed as limiting the idea of the present invention by the accompanying drawings.

Figure 2:
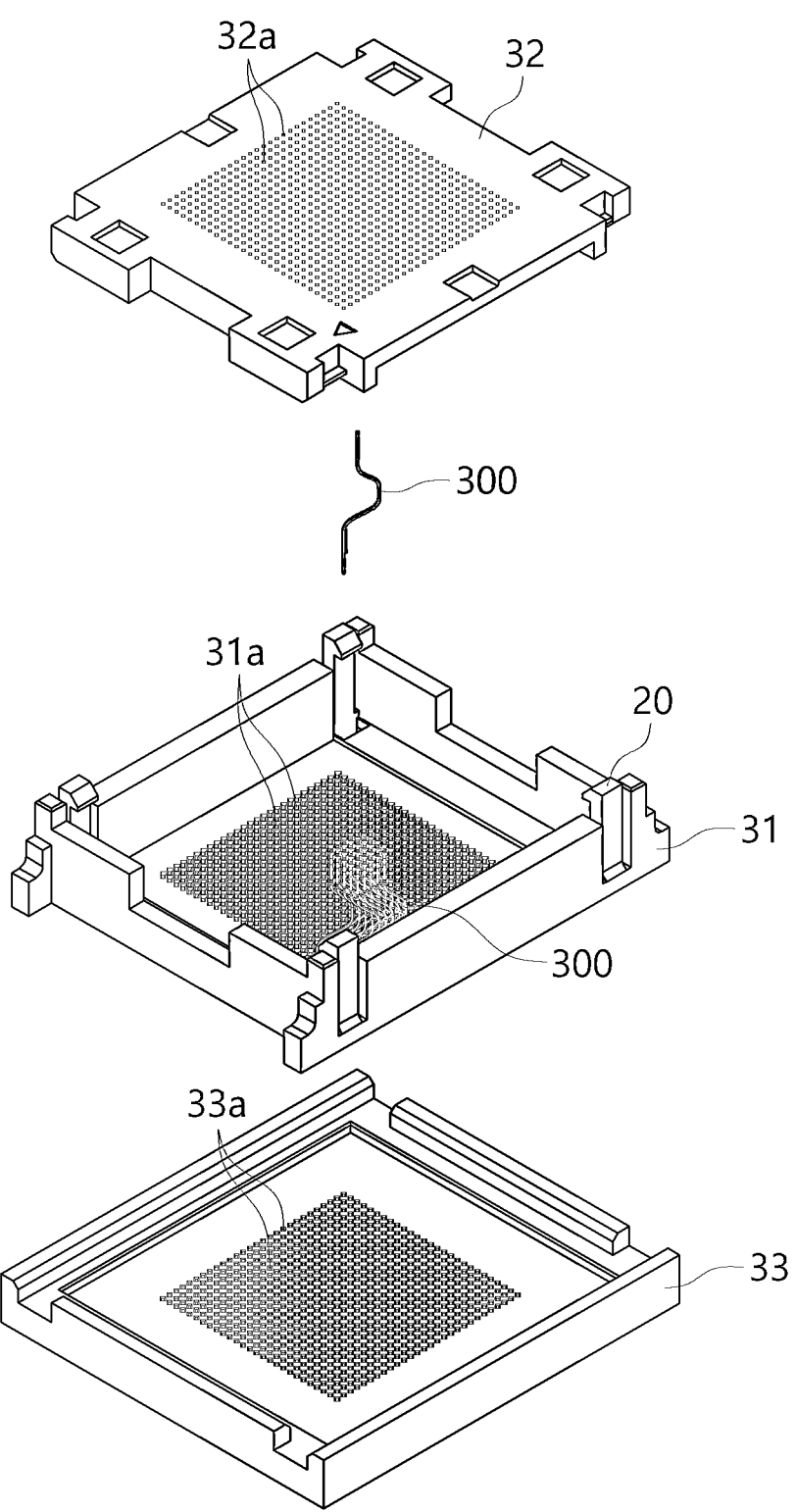
FIG. 2 is an exploded perspective view of a test socket assembly device according to an exemplary embodiment of the present invention.

FIG. 1 is an overall perspective view of a test socket assembly device according to an exemplary embodiment of the present invention, and FIG. 2 is an exploded perspective view of a test socket assembly device according to an exemplary embodiment of the present invention.

Hereinafter, what includes a press-fit plate 33 in the test socket will be referred to as a test socket assembly device 30.

Referring to FIGS. 1 and 2, the test socket assembly device 30 according to an exemplary embodiment of the present invention may include a housing 31, a cover 32, a press-fit plate 33, and a plurality of contact pins 300.

Here, a plurality of first through holes 31a are formed in the housing 31, a plurality of second through holes 32a are formed in the cover 32, and the plurality of contact pins 300 are provided between the housing 31 and the cover 32.

In addition, the press-fit plate 33 is formed with a plurality of press-fit grooves 33a and is coupled to the lower part of the housing 31.

The press-fit plate 33 may be coupled to and removed from the housing 31. That is, the press-fit plate 33 is coupled to the lower part of the housing 31 during assembly of the test socket 30, and is removed from the lower part of the housing 31 when the assembly of the test socket 30 is completed.

The test socket of the present invention means what remains after the press-fit plate 33 is removed from the test socket assembly device 30.

The plurality of first through holes 31a may be formed in a plurality of rows and columns in the housing 31, and the plurality of second through holes 32a may be formed in a plurality of rows and columns in the cover 32. In addition, the plurality of press-fit grooves 33a are formed in the press-fit plate 33 and are formed in a plurality of rows and columns at positions corresponding to the plurality of first through holes 31a.

Lower ends of the plurality of contact pins 320 may be inserted standing up into the first through holes 31a formed in the housing 31 and the press-fit grooves 33a formed in the press-fit plate 33, and in this state, upper ends of the plurality of contact pins 300 may be inserted into the second through holes 32a formed in the cover 32.

The test socket is placed between a semiconductor device and a test device to electrically connect a connection terminal (e.g., conductive ball) of the semiconductor device to be inspected and a connection terminal (e.g., contact pad) of the test device to each other in electrical inspection of semiconductor integrated circuit devices such as package ICs and MCMs, and wafers on which integrated circuits are formed, and the like.

The contact pin 300 electrically connects the connection terminal of the semiconductor device and the connection terminal of the test device to perform an electrical inspection between the semiconductor device and the test device.

The contact pin 300 may be processed (cutting and bending) using a precision mold-based press process to improve price competitiveness and productivity.

The plurality of contact pins 300 may be automatically inserted and assembled into the plurality of first through holes 31a formed in the housing 31 by an automatic insertion device (not shown).

The housing 31 may have a box shape with an open upper portion, and at each corner thereof, a hook 20 for coupling and fixing the cover 32 may be provided. In addition, the cover 32 may have a latching jaw 21 at a position corresponding to the hook 20.

Here, while the latching jaw 21 of the cover 32 is located on the hook 20 of the housing 31, when the cover 32 is pressed and the hook 20 is caught on the latching jaw 21, the housing 31 and the cover 32 may be fixed so that they are not separated.

Figure 3:
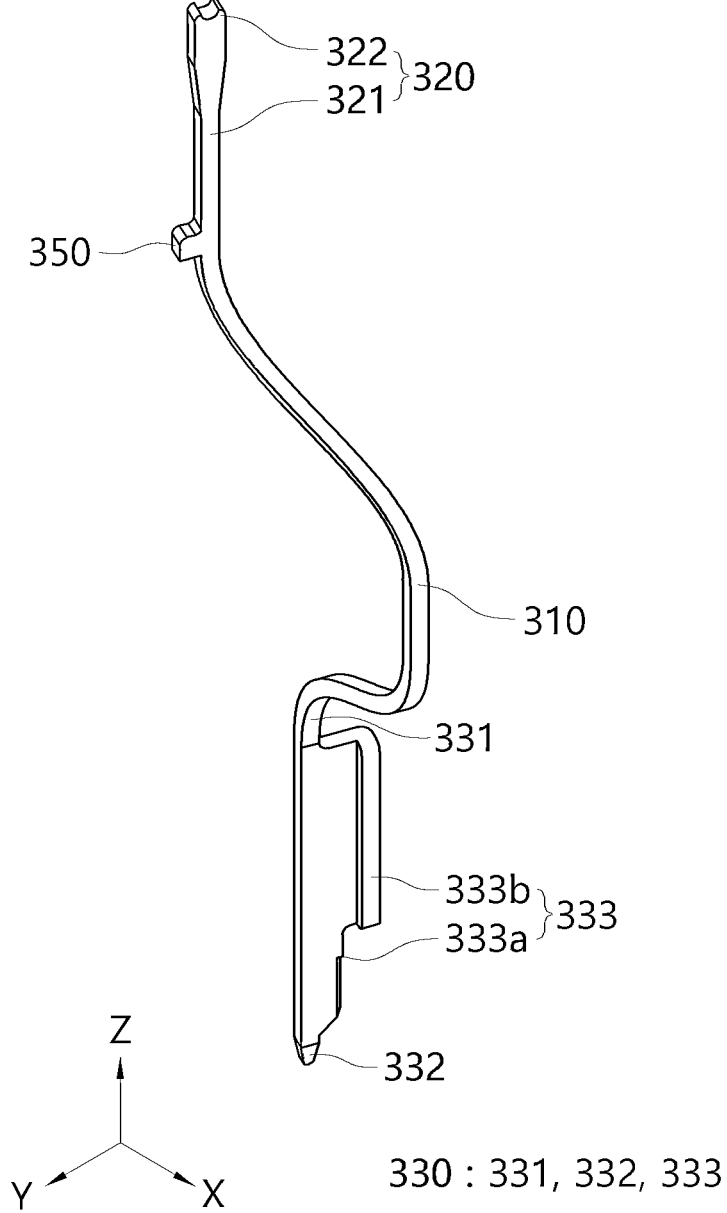
FIG. 3 is a perspective view of a contact pin according to an exemplary embodiment of the present invention.
Figure 4:
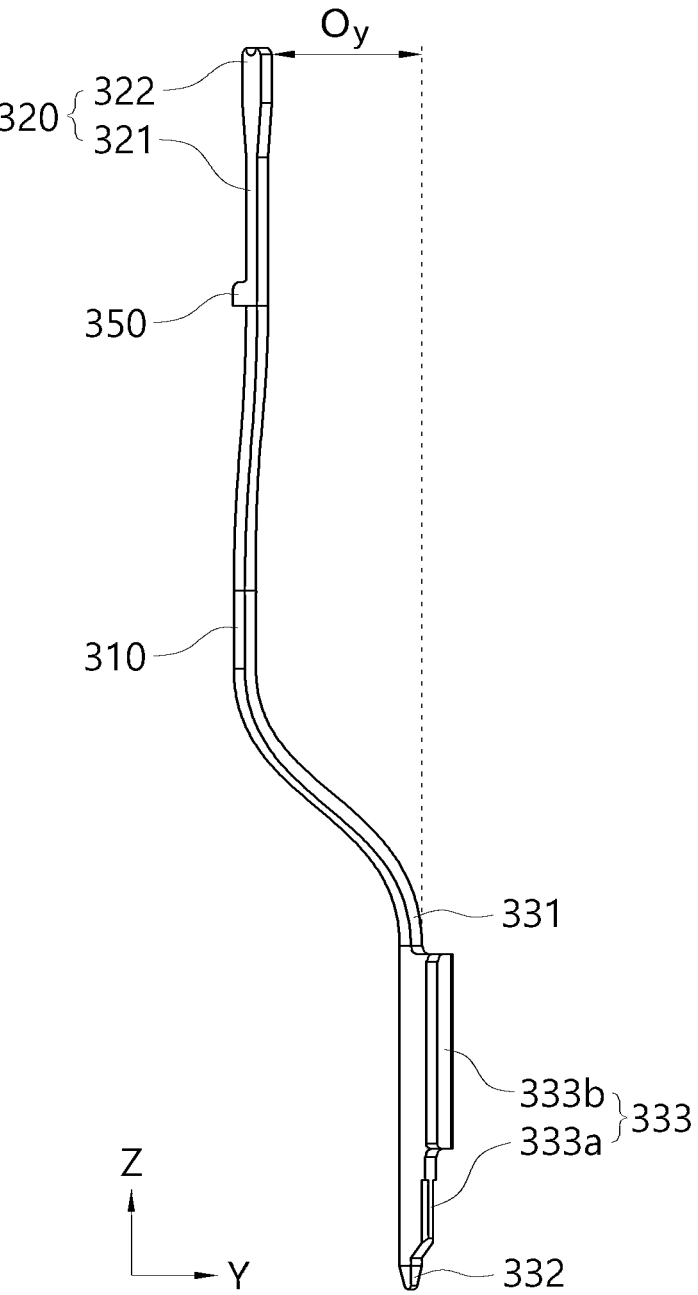
FIG. 4 is a side view of a contact pin according to an exemplary embodiment of the present invention.
Figure 5:
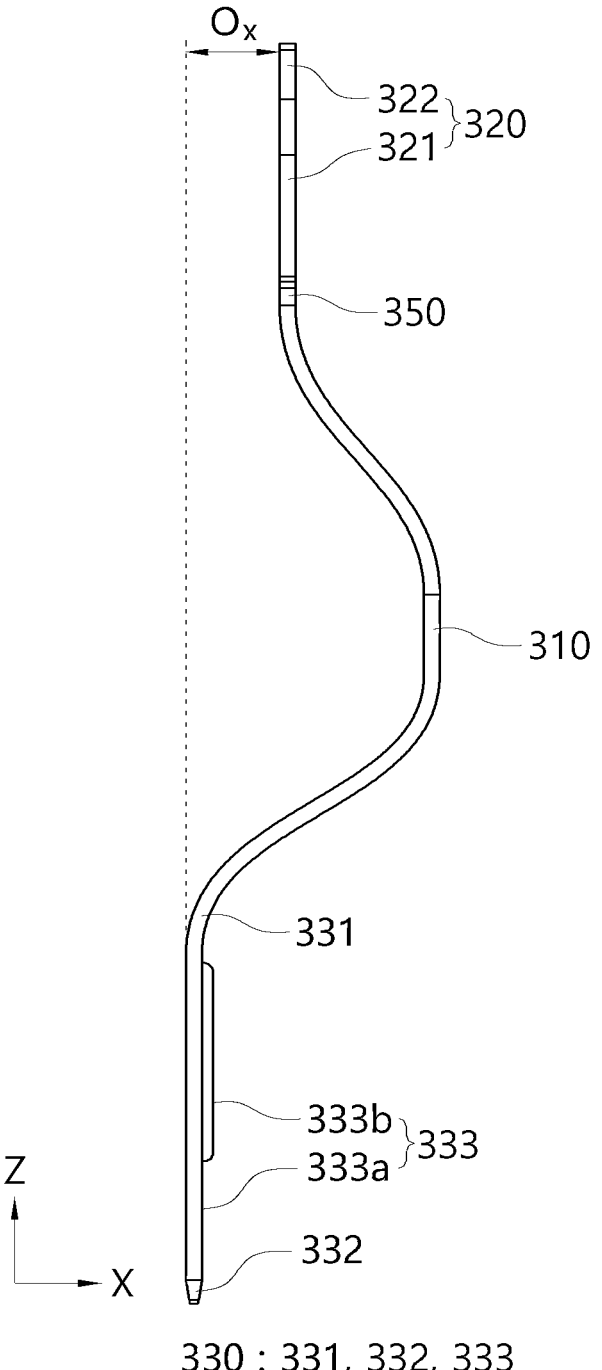
FIG. 5 is another side view of a contact pin according to an exemplary embodiment of the present invention.
Figure 6:
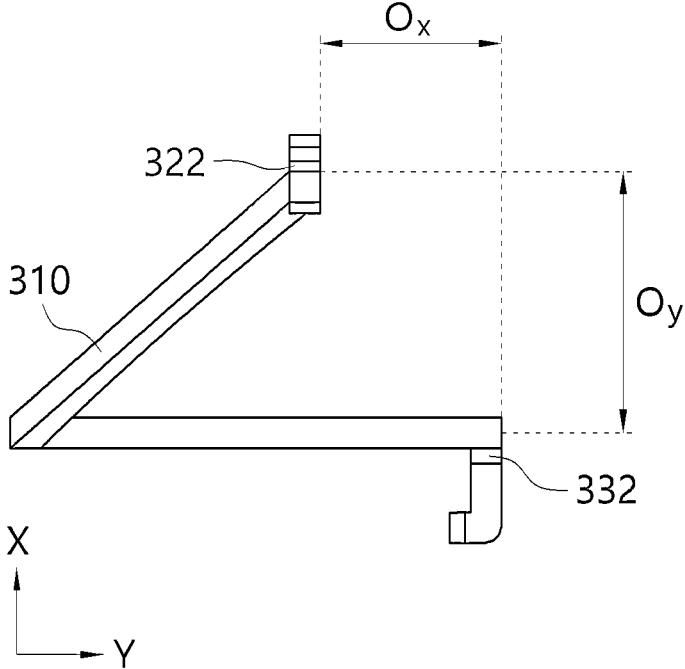
FIG. 6 is a top plan view of a contact pin according to an exemplary embodiment of the present invention.

FIG. 3 is a perspective view of a contact pin according to an exemplary embodiment of the present invention, FIG. 4 is a side view of a contact pin according to an exemplary embodiment of the present invention, FIG. 5 is another side view of a contact pin according to an exemplary embodiment of the present invention, and FIG. 6 is a top plan view of a contact pin according to an exemplary embodiment of the present invention.

Referring to FIGS. 3 to 6, the contact pin 300 may include an elastic part 310, a first contact part 330, and a second contact part 320.

The elastic part 310 may be elastically deformed in the longitudinal direction (z direction) of the contact pin 300, and may be formed in a curved shape, but is not limited thereto.

The first contact part 330 may include a first support part 331 extending from one end of the elastic part 310 and a stroke part 333 connected to an end of the first support part 331 and movable in the longitudinal direction, and a first contact tip 332 connected to an end of the stroke part 333. Here, the first contact tip 332 may be in contact with the contact pad of the test device.

The second contact part 320 may include a second support part 321 extending from the other end of the elastic part 310 and a second contact tip 322 connected to an end of the second support part 321. Here, the second contact tip 322 may be in contact with a conductive ball of a semiconductor device.

The elastic part 310 may contract in the longitudinal direction of the contact pin 300 when the conductive ball of the semiconductor device is in contact with the second contact tip 322 and pressed, and may return to its original state when the pressure is released.

The elastic part 310 and the second contact part 320 may be bent in a first direction (x direction) with respect to the first contact part 330 (see FIG. 5), and may be bent again in a second direction (y direction) with respect to the first contact part 330 (see FIG. 4). In this case, the elastic part 310 may be bent and curved and may be formed by being twisted into a three-dimensional shape.

When the first contact tip 332 contacts the contact pad of the test device and the second contact tip 322 contacts the conductive ball of the semiconductor device, the contact pin 300 forms an electrical signal path between the test device and the semiconductor device. Accordingly, the test device may inspect the electrical characteristics of the semiconductor device.

Referring to FIGS. 4 to 6, since the elastic part 310 is bent in the first direction (x-direction) and the second direction (y-direction) of the contact pin 300, the elastic part 310 may be located on a different plane from the first contact part 330 and the second contact part 320.

In addition, the first contact part 330 and the second contact part 320 may be formed in a straight line shape and may be located on different lines.

Accordingly, the contact pin 300 may generate an offset Ox in the first direction (x-direction) and an offset Oy in the second direction (y-direction) between the first contact tip 332 and the second contact tip 322.

A first stopper 342 and a second stopper 350 for restricting the contact pin 300 to the housing 31 and the cover 32 of the test socket 30 may be formed on one side or both sides of the first support part 331 or the second support part 321.

Here, the contact pin 300 may be moved up and down by an elastic force of the elastic part 310, and in this case, the contact pin 300 is restricted by the first and second stoppers 342 and 350 being caught by the first and second through holes 31*a* and 32*a*.

Figure 7:
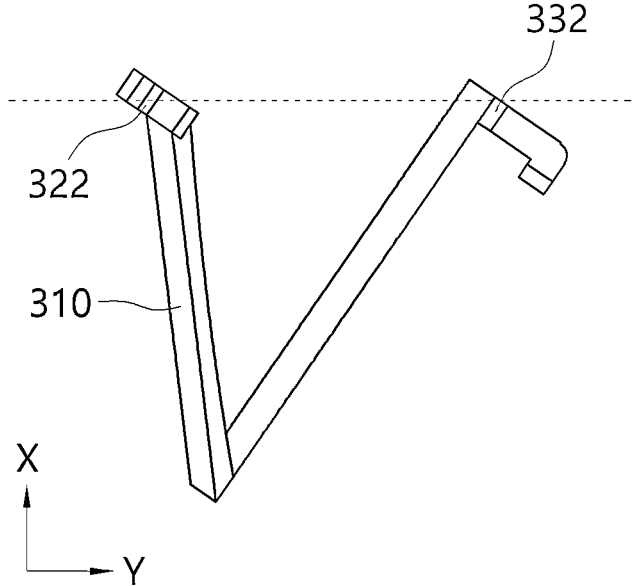
FIG. 7 is a view showing a contact pin according to an exemplary embodiment of the present invention before insertion.
Figure 8:
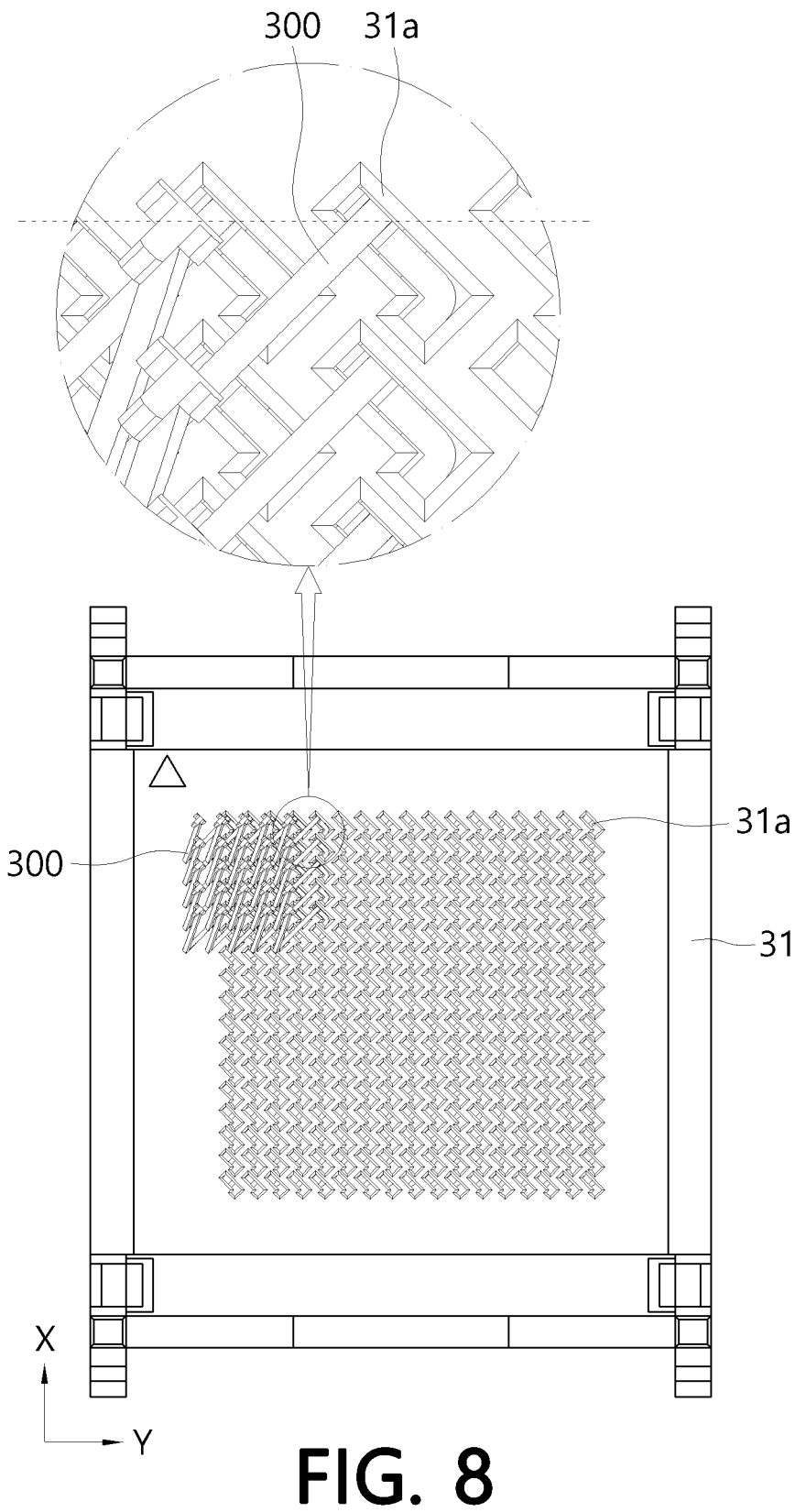
FIG. 8 is a view showing a state in which a contact pin according to an exemplary embodiment of the present invention is inserted into a housing.

FIG. 7 is a view showing a contact pin according to an exemplary embodiment of the present invention before insertion, and FIG. 8 is a view showing a state in which a contact pin according to an exemplary embodiment of the present invention is inserted into a housing.

Referring to FIGS. 7 and 8, the plurality of contact pins 300 are inserted standing up into the plurality of first through holes 31*a* formed in the housing 11 with their first contact tips 332 starting to be inserted first.

Specifically, the plurality of contact pins 300 are inserted into the plurality of first through holes 31*a* by being inclined at a predetermined angle such that the first contact tip 332 and the second contact tip 322 are positioned on the axis in the second direction (y-direction). For example, when the first direction (x-direction) offset Ox and the second direction (y-direction) offset Oy between the first contact tip 332 and the second contact tip 322 are the same, the plurality of contact pins 300 are inclined at an angle of 45 degrees and inserted into the plurality of first through holes 31*a*.

Here, the plurality of first through holes 31*a* and second through holes 32*a* are formed in an oblique shape such that the first contact tip 332 and the second contact tip 322 are positioned on the axis in the second direction (y-direction). For example, when the first direction (x-direction) offset Ox and the second direction (y-direction) offset Oy between the first contact tip 332 and the second contact tip 322 are the same, the plurality of first through holes 31*a* and second through holes 32*a* may be formed in an oblique shape inclined at an angle of 45 degrees.

Accordingly, the offset Oy in the second direction (y-direction) between the first contact tip 332 and the second contact tip 322 may be removed.

In this case, since the elastic part 310 has a curved shape and the first contact part 330 and the second contact part 320 have a linear shape, when the contact pin 300 is inserted, the gap between the elastic part 310 and the first contact part 330 or the second contact part 320 of the neighboring contact pin 300 inserted earlier becomes the narrowest. Therefore, there is a high possibility that this part will collide or interfere with the insertion of the contact pin 300.

Since the elastic part 310 and the first contact part 330 are bent in the first direction (x-direction) and the second direction (y-direction) with respect to the second contact part 320 and the plurality of contact pins 300 are inserted into the plurality of first through holes 31*a* by tilting the plurality of contact pins 300 at a certain angle so that the first contact tip 332 and the second contact tip 322 are positioned on the axis in the second direction (y-direction), more sufficient insertion space may be secured.

Accordingly, even if the gap between the contact pins 300 is formed at a fine pitch, collision or interference with the adjacent contact pins 300 inserted earlier may be prevented.

Therefore, the test socket according to an exemplary embodiment of the present invention may form a plurality of contact pins 300 at a smaller pitch, and may prevent interference or collision between the contact pins 300 when the plurality of contact pins 300 are automatically inserted.

In addition, since the first contact tip 332 and the second contact tip 322 are located on different lines, a plurality of contact pins 300 may be inserted more densely than those located on the same line.

Meanwhile, the test socket according to an exemplary embodiment of the present invention is assembled by inserting the lower ends of the plurality of contact pins 300 standing up into the first through holes 31*a* formed in the housing 31, and in this state, inserting the upper ends of the plurality of contact pins 300 into the second through holes 32*a* formed in the cover 32.

Here, if the plurality of contact pins 300 are not fixed while inserted standing up into the first through holes 31*a*, the second through holes 32*a* may not be accurately inserted into the upper ends of the plurality of contact pins 300. In particular, the larger the number of contact pins 300 and the smaller the gap between the contact pins 300, the more difficult it is to accurately insert the second through holes 32*a* into the upper ends of the plurality of contact pins 300.

However, when the lower ends of the plurality of contact pins 300 are fixed to the first through holes 31*a*, there is a problem that the flatness tolerance of the test device cannot be compensated.

That is, if the lower ends of the plurality of contact pins 300 are fixed to the first through holes 31*a* and the test device has a flatness tolerance, when the first contact tips 332 of the plurality of contact pins 300 contact the contact pad of the test device and are pressed, there is a problem that some of the plurality of contact pins 300 are not in contact with the contact pad of the test device.

To solve these problems, the test socket assembly device 30 according to an exemplary embodiment of the present invention includes a press-fit plate 33.

Figure 9:
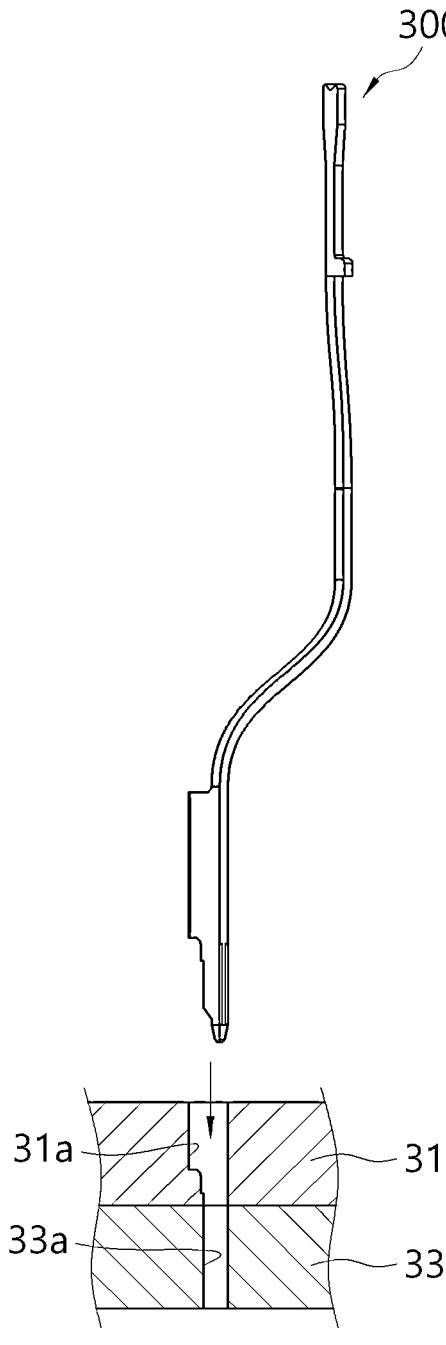
FIG. 9 is a side cross-sectional view of a test socket assembly device according to an exemplary embodiment of the present invention, showing a state before a contact pin is inserted into a housing and a press-fit plate.
Figure 10:
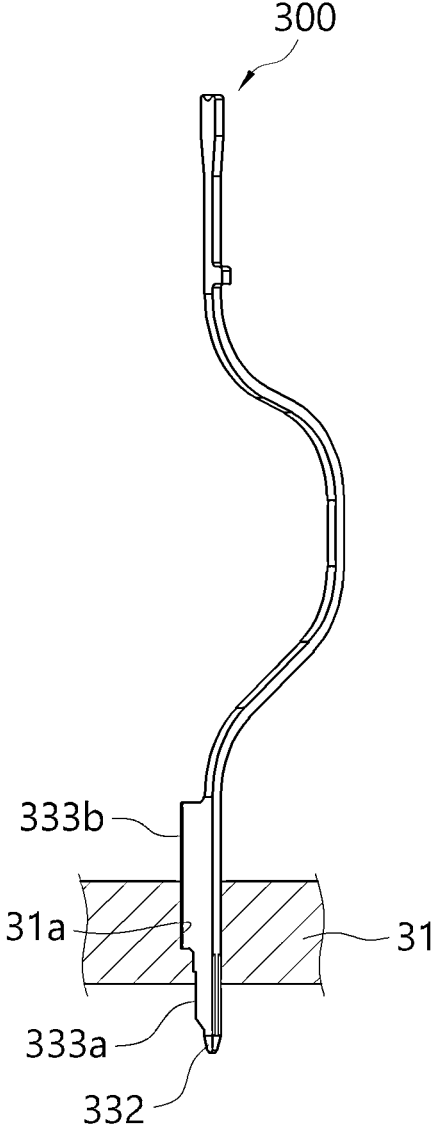
FIG. 10 is a side cross-sectional view of a test socket according to an exemplary embodiment of the present invention, showing a state after a contact pin is inserted into a housing and a press-fit plate.

FIG. 9 is a side cross-sectional view of a test socket assembly device according to an exemplary embodiment of the present invention, showing a state before a contact pin is inserted into a housing and a press-fit plate, and FIG. 10 is a side cross-sectional view of a test socket according to an exemplary embodiment of the present invention, showing a state after a contact pin is inserted into a housing and a press-fit plate.

Referring to FIG. 9, the press-fit plate 33 has a plurality of press-fit grooves 33*a* into which a plurality of contact pins 300 are inserted to fix the plurality of contact pins 300 to the housing 31 during assembly of the test socket 30.

Here, the press-fit grooves 33*a* may be formed at positions corresponding to the plurality of first through holes 31*a*.

The press-fit plate 33 may be coupled to and removed from the housing 31. That is, it is coupled to the lower part of the housing 31 during assembly of the test socket, and is removed from the lower part of the housing 31 when the assembly of the test socket is completed.

The first through hole 31*a* formed in the housing 31 includes a first stroke hole 1*a* formed on the first contact tip 332 side and a second stroke hole 1*b* communicating with the first stroke hole 1*a* and having a greater width than the first stroke hole 1*a*.

Here, at least one stepped jaw part 2 is formed between the first stroke hole 1*a* and the second stroke hole 1*b* in the first through hole 31*a*.

The plurality of contact pins 300 include a stroke part 333 connected to the end of the first support part 331 and movable in the longitudinal direction. Here, the stroke part 333 may have a larger width than the first support part 331. For example, the stroke part 333 may be provided in a form protruding outward from at least one direction with respect to the first support part 331.

Specifically, the stroke part 333 may include an exposed part 333*a* and a first stopper 333*b*.

Here, the first stopper 333*b* may be provided in a form that protrudes further outward than the exposed part 333*a*.

The first stroke hole 1*a* has a larger width than the exposed part 333*a* and a smaller width than the first stopper 333*b*. And the second stroke hole 1*b* has a larger width than the first stopper 333*b*.

And the plurality of press-fit grooves 33*a* formed in the press-fit plate 33 are formed to have a smaller width than the exposed part 341.

As shown in FIG. 10, when the stroke part 333 of the plurality of contact pins 300 is inserted into the first through hole 31*a* and the press-fit groove 33*a*, the first stopper 333*b* is caught by the stepped jaw part 2 to limit the downward movement of the plurality of contact pins 300, and at least a portion of the exposed part 333*a* is exposed from the through hole 31*a* to the outside.

And the first contact tip 332 and the exposed part 333*a* exposed to the outside are forcibly fitted and fixed to the press-fit groove 33*a*.

Here, since the exposed part 333*a* has a smaller width than the first stroke hole 1*a*, it is not fixed to the first stroke hole 1*a*, and since the first stopper 333*b* has a smaller width than the second stroke hole 1*b*, the first stopper 333*b* is not fixed to the second stroke hole 1*b*.

And the exposed part 333*a* is fixed to the press-fit groove 33*a* since it has a larger width than the press-fit groove 33*a* and is forcibly fitted to the press-fit groove 33*a*.

That is, the plurality of contact pins 300 are not fixed to the plurality of first through holes 31*a*, but are fixed to the plurality of press-fit grooves 33*a*.

In this way, since the plurality of contact pins 300 are fixed by the press-fit plate 33 while inserted standing up into the first through holes 31*a*, the second through holes 32*a* may be accurately inserted into the upper ends of the plurality of contact pins 300. In particular, even if the number of contact pins 300 is large and the gap between the contact pins 300 is small, it is easy to accurately insert the second through holes 32*a* into the upper ends of the plurality of contact pins 300.

Figure 11:
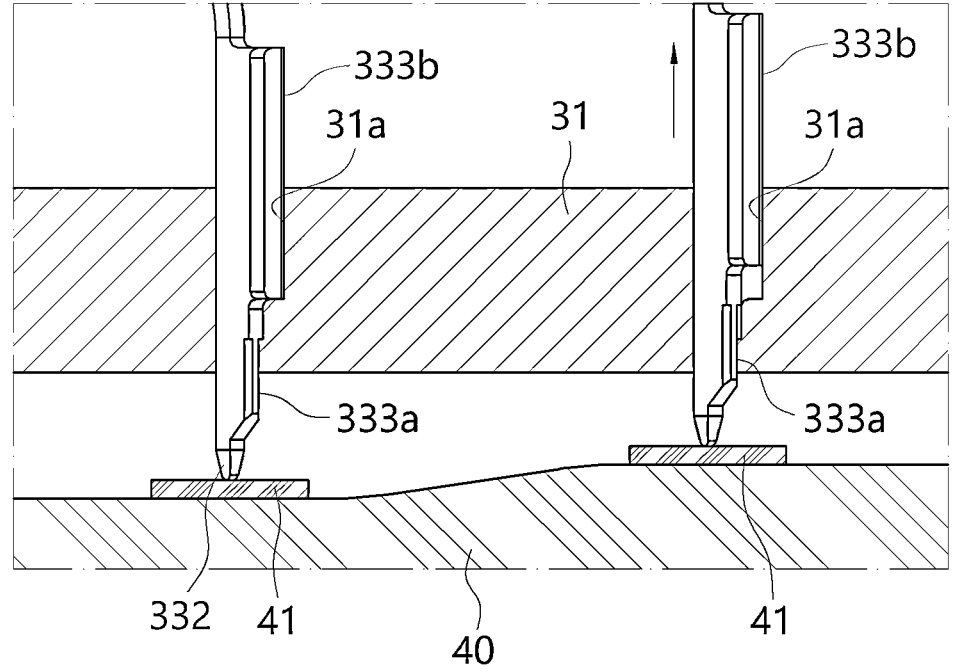
FIG. 11 is a side cross-sectional view of a test socket according to an exemplary embodiment of the present invention.

FIG. 11 is a side cross-sectional view of a test socket according to an exemplary embodiment of the present invention.

Referring to FIG. 11, the exposed part 333*a* is inserted into the first stroke hole 1*a*, and at least a portion thereof is exposed in the first through hole 31*a*. And at least a portion of the first stopper 333*b* is inserted into the second stroke hole 1*b* and is caught by the stepped jaw part 2 formed between the first stroke hole 1*a* and the second stroke hole 1*b* to constrain the downward movement of the stroke part 333.

The first stopper 333*b* further protrudes outward in at least one direction than the exposed part 333*a*. Accordingly, when the lower portions of the plurality of contact pins 300 are inserted into the first through holes 31*a*, the exposed part 333*a* may pass through the second stroke hole 1*b*, but the first stopper 333*b* may be caught by the stepped jaw part 2 and may not pass through the second stroke hole 1*b*.

The first stroke hole 1*a* has a larger width than the exposed part 333*a* and a smaller width than the first stopper 333*b*. Accordingly, the exposed part 333*a* may move along the first stroke hole 1*a*, but the first stopper 333*b* may not move along the first stroke hole 1*a*.

The second stroke hole 1*b* has a larger width than the first stopper 333*b*. Accordingly, the first stopper 333*b* may move along the second stroke hole 1*b*.

The length of the exposed part 333*a* exposed in the first through hole 31*a* varies depending on the external force applied to the first contact tip 332. That is, the greater the external force applied to the first contact tip 332, the shorter the length of the exposed part 333*a* exposed in the first through hole 31*a*, and the smaller the external force applied to the first contact tip 332, the longer the length of the exposed part 333*a* exposed in the first through hole 31*a*. However, the increasing length of the exposed part 333*a* is limited due to the first stopper 333*b*.

As shown in FIG. 11, if a plurality of contact pads 41 of a test device 40 have flatness tolerances, when the first contact tips 332 of the plurality of contact pins 300 are connected to the plurality of contact pads 41, for example, (a) when a first contact pad is provided at a position lower than a second contact pad in the vicinity, an external force applied by the first contact pad to the first contact tip 332 is smaller than that of the second contact pad in the vicinity, (b) when the first contact pad is provided at a position higher than the second contact pad in the vicinity, an external force applied by the first contact pad to the first contact tip 332 is greater than that of the second contact pad.

Here, when the contact pad 41 of the test device 40 applies an external force to the first contact tip 332 of the contact pin 300, the elastic part 310 is elastically deformed to move the stroke part 333 upward as the second stopper 350 is restrained by the second through hole 32*a*. In this case, the degree to which the stroke part 333 moves upward is proportional to the external force applied by the contact pad 41 to the first contact tip 332 of the contact pin 300.

Thereafter, when the external force applied by the contact pad 41 of the test device 40 to the first contact tip 332 of the contact pin 300 is released after the test is completed, the elastic part 310 is returned to its original state to move the stroke part 333 downward as the second stopper 350 is restrained by the second through hole 32*a*.

Using this principle, in the present invention, even when the plurality of contact pads 41 of the test device 40 have flatness tolerances, the stroke parts 333 of the plurality of contact pins 320 are not fixed to the first through holes 31*a* and are configured to be movable in the up-down direction, so that the plurality of first contact tips 332 may be brought into contact with all of the plurality of contact pads 41.

FIGS. 12 to 15 are views for describing a method for assembling a test socket according to an exemplary embodiment of the present invention.

Figure 12:
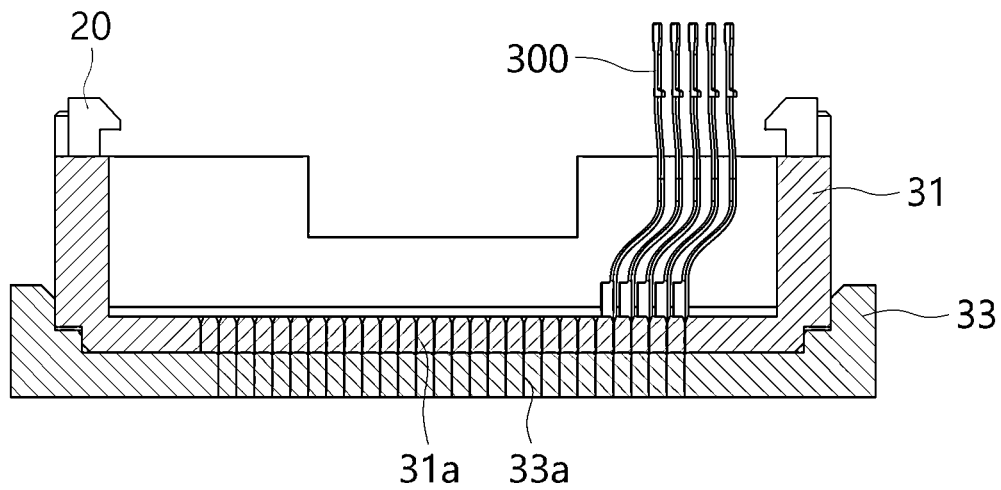
FIGS. 12 to 15 are views for describing a method for assembling a test socket according to an exemplary embodiment of the present invention.

First, referring to FIG. 12, the press-fit plate 33 is coupled to the lower part of the housing 31, and a fixing member (not shown) is fastened to fix the press-fit plate 33 to the housing 31. In this case, the plurality of press-fit grooves 33*a* of the press-fit plate 33 are formed at positions corresponding to the plurality of first through holes 31*a* of the housing 31.

Next, the stroke part 333 is inserted into the first through hole 31*a* while the plurality of contact pins 300 stands up. In this case, since the press-fit groove 33*a* formed in the press-fit plate 33 is formed to have a smaller width than the exposed part 333*a*, the first contact tip 332 and at least a portion of the exposed part 333*a* of the stroke part 333 are exposed in the first through hole 31*a* and are forcibly fitted into the press-fit groove 33*a*. Accordingly, the plurality of contact pins 300 are fixed to the housing 31.

Meanwhile, since the exposed part 333*a* is forcibly fitted into the press-fit groove 33*a*, the press-fit plate 33 is preferably made of a plastic material to prevent damage to the first contact tip 332 during forcible press-fit.

Figure 13:
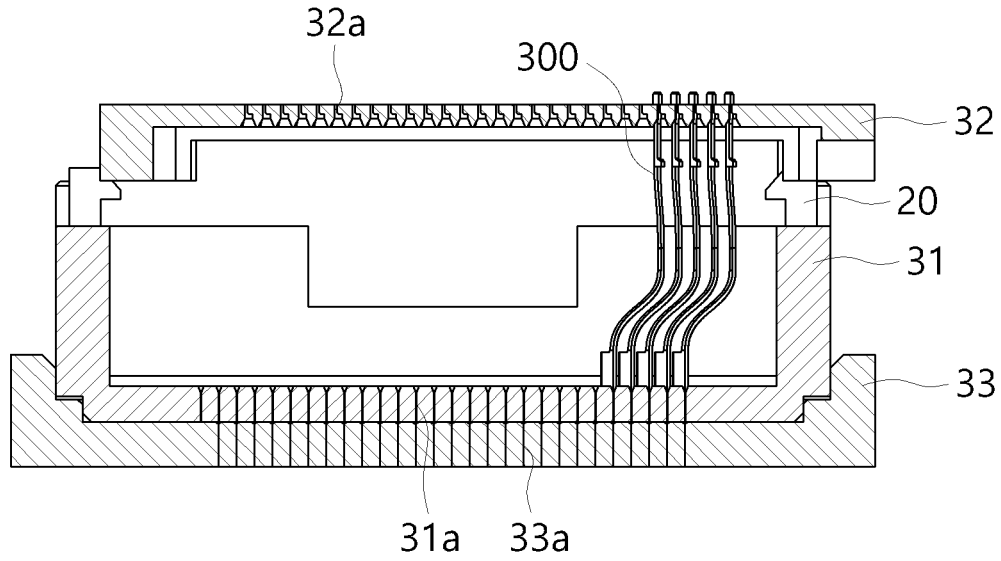

Next, referring to FIG. 13, in a state in which the stroke parts 333 of the plurality of contact pins 300 are inserted into the first through holes 31*a* and the press-fit grooves 33*a*, the second contact tips 322 are inserted into the plurality of second through holes 32*a* formed in the cover 32.

In this case, since the plurality of contact pins 300 are fixed by the press-fit plate 33 while inserted standing up into the first through holes 31*a*, the second through holes 32*a* may be accurately inserted into the upper ends of the plurality of contact pins 300. In particular, even if the number of contact pins 300 is large and the gap between the contact pins 300 is small, it is easy to accurately insert the second through holes 32*a* into the upper ends of the plurality of contact pins 300.

Meanwhile, in this state, an offset Ox in the first direction (x-direction) exists between the first contact tip 332 and the second contact tip 322.

Figure 14:
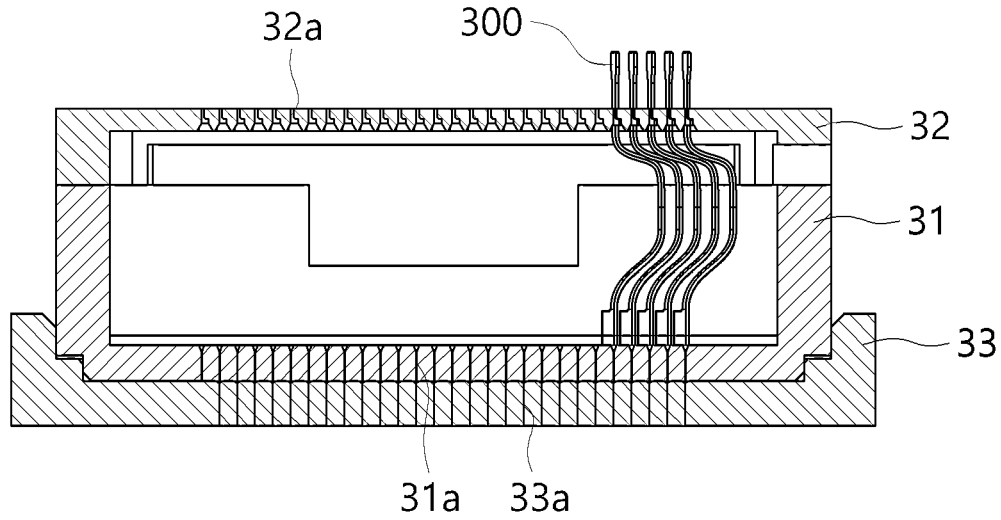

Next, referring to FIG. 14, in a state in which the second contact part 320 is inserted into the second through hole 32*a*, the cover 32 moves the second contact portion 320 in the first direction (x-direction) to position the first contact tip 332 and the second contact tip 322 on the axis in the first direction (x-direction).

In this case, even though the second contact part 320 moves in the first direction (x-direction), interference or collision between the contact pins 300 does not occur.

Accordingly, the offset Ox in the first direction (x-direction) between the first contact tip 332 and the second contact tip 322 may be removed. That is, the first contact tip 332 and the second contact tip 322 are positioned on the same line, and the pitch between the contact pins 300 may be further reduced.

Next, in a state in which the latching jaw 21 of the cover 32 is positioned on the hook 20 of the housing 31, the cover 32 is pressed so that the hook 20 is caught by the latching jaw 21. Accordingly, the housing 31 and the cover 32 are fixed so as not to be separated.

Figure 15:
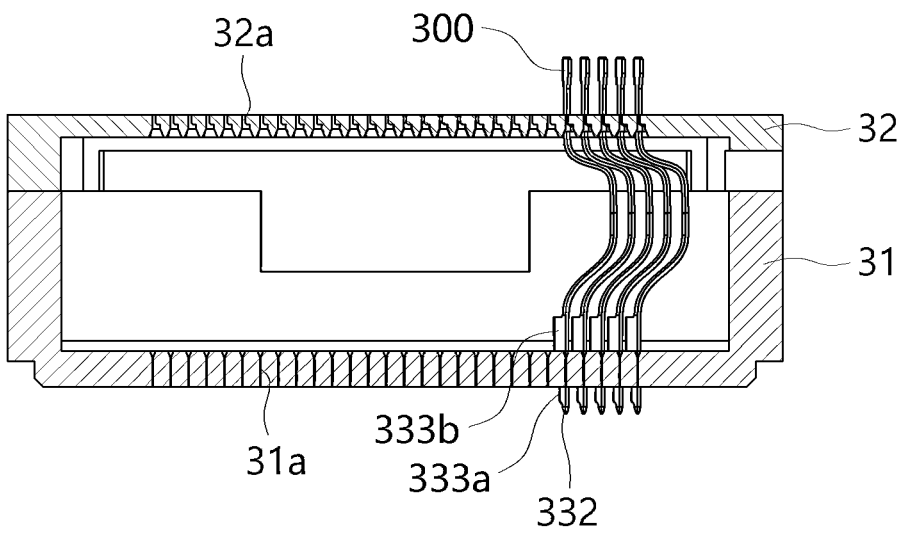

Next, referring to FIG. 15, the press-fit plate 33 is removed from the housing 31 by releasing the fastening of the fixing member (not shown). Accordingly, the assembly of the test socket 30 according to an exemplary embodiment of the present invention is completed.

As described above, the present invention is configured to move the lower ends of the plurality of contact pins 320 in the up-down direction even when the plurality of contact pads of the test device have flatness tolerances, so that the plurality of first contact tips 332 can all contact the plurality of contact pads 41.

The embodiments described in the present specification and the accompanying drawings are merely illustrative of some of the technical ideas included in the present invention. Accordingly, since the embodiments disclosed in the present specification are not intended to limit the technical idea of the present invention, but are for illustrative purposes, it is obvious that the scope of the technical idea of the present invention is not limited by these embodiments. Modifications and specific embodiments that can be easily inferred by those skilled in the art within the scope of the technical idea included in the specification and drawings of the present invention should be construed as being included in the scope of the present invention.

What is claimed is:

1. A test socket for testing the electrical characteristics of a semiconductor device, the test socket comprising:
   a housing in which a plurality of first through holes are formed;
   a cover in which a plurality of second through holes are formed; and
   a plurality of contact pins inserted into the plurality of first and second through holes,
   wherein the plurality of contact pins comprises:
   an elastic part capable of elastic deformation in a longitudinal direction;
   a first contact part comprising: a first support part extending from one end of the elastic part, a stroke part connected to an end of the first support part and movable in the longitudinal direction, and a first contact tip connected to an end of the stroke part and exposed in the first through hole; and
   a second contact part comprising: a second support part extending from the other end of the elastic part, and a second contact tip connected to an end of the second support part and exposed in the second through hole,
   wherein the first through hole comprises a first stroke hole formed on a side of the first contact tip and a second stroke hole that communicates with the first stroke hole and has a larger width than the first stroke hole,
   wherein the first through hole has a stepped jaw part formed between the first and second stroke holes,
   wherein the stroke part comprises:
   an exposed part that is inserted into the first stroke hole and at least a portion of which is exposed in the first through hole; and
   a first stopper that is inserted into the second stroke hole and is caught by the stepped jaw part to restrict movement of the stroke part.

2. The test socket according to claim 1, wherein the first stopper protrudes further outward than the exposed part.

3. The test socket according to claim 1, wherein the length of the exposed part exposed in the first through hole varies depending on the external force applied to the first contact tip.

4. The test socket according to claim 1, wherein the first stroke hole has a larger width than the exposed part and a smaller width than the first stopper.

5. The test socket according to claim 1, wherein the second stroke hole has a larger width than the first stopper.

6. The test socket according to claim 1, wherein the second contact part further comprises a second stopper that is provided on one side of the second support part and restrains movement of a third contact part.

7. A device for assembling a test socket for testing electrical characteristics of a semiconductor device, the test socket assembly device comprising:
   a housing in which a plurality of first through holes are formed;
   a cover in which a plurality of second through holes are formed;
   a plurality of contact pins inserted into the plurality of first and second through pin; and
   a press-fit plate having a plurality of press-fit grooves into which the plurality of contact pins are inserted and capable of being coupled to and removable from the housing, wherein the plurality of contact pins comprises:

an elastic part capable of elastic deformation in a longitudinal direction;

a first contact part comprising: a first support part extending from one end of the elastic part, a stroke part connected to an end of the first support part and movable in the longitudinal direction, and a first contact tip connected to an end of the stroke part and exposed in the first through hole; and a second contact part comprising: a second support part extending from the other end of the elastic part, and a second contact tip connected to an end of the second support part and exposed in the second through hole, wherein the first through hole comprises a first stroke hole formed on a side of the first contact tip and a second stroke hole that communicates with the first stroke hole and has a larger width than the first stroke hole, wherein the first through hole has a stepped jaw part formed between the first and second stroke holes, and wherein the stroke part comprises:

an exposed part that is inserted into the first stroke hole and at least a portion of which is exposed in the first through hole; and a first stopper that is inserted into the second stroke hole and is caught by the stepped jaw part to restrict movement of the stroke part.

8. The test socket assembly device according to claim 7, wherein the first stopper protrudes further outward than the exposed part.

9. The test socket assembly device according to claim 7, wherein the first stroke hole has a larger width than the exposed part and a smaller width than the first stopper, and the second stroke hole has a larger width than the first stopper.

10. The test socket assembly device according to claim 7, wherein the press-fit groove is formed to have a smaller width than the exposed part.

11. The test socket assembly device according to claim 7, wherein the exposed part is forcibly fitted and fixed to the press-fit groove.

* * * * *